United States Patent
Nie et al.

(10) Patent No.: US 11,211,506 B2
(45) Date of Patent: *Dec. 28, 2021

(54) SELF-BYPASS DIODE FUNCTION FOR GALLIUM ARSENIDE PHOTOVOLTAIC DEVICES

(71) Applicant: UTICA LEASECO, LLC, Rochester Hills, MI (US)

(72) Inventors: Hui Nie, Cupertino, CA (US); Brendan M. Kayes, Los Gatos, CA (US); Isik C. Kizilyalli, San Francisco, CA (US)

(73) Assignee: UTICA LEASECO, LLC, Rochester Hills, MI (US)

( * ) Notice: Subject to any disclaimer, the term of this patent is extended or adjusted under 35 U.S.C. 154(b) by 137 days.

This patent is subject to a terminal disclaimer.

(21) Appl. No.: 15/656,575

(22) Filed: Jul. 21, 2017

(65) Prior Publication Data

US 2017/0323987 A1 Nov. 9, 2017

Related U.S. Application Data

(63) Continuation of application No. 13/023,733, filed on Feb. 9, 2011, now Pat. No. 9,716,196.

(51) Int. Cl.
*H01L 31/0304* (2006.01)
*H01L 27/142* (2014.01)
(Continued)

(52) U.S. Cl.
CPC ...... *H01L 31/03046* (2013.01); *H01L 27/142* (2013.01); *H01L 31/0304* (2013.01);
(Continued)

(58) Field of Classification Search
CPC ............... H01L 31/0443; H01L 31/072
See application file for complete search history.

(56) References Cited

U.S. PATENT DOCUMENTS 4,568,792 A * 2/1986 Mooney .............. H01L 31/0296
136/260
4,582,952 A  4/1986 Mcneely et al.
(Continued)

FOREIGN PATENT DOCUMENTS

CN  101916792 A  12/2010
EP    0693787 A2   1/1996
(Continued)

OTHER PUBLICATIONS

European Office Action corresponding to European Application No. 17198268.9, dated Feb. 20, 2019.
(Continued)

*Primary Examiner* — Magali P Slawski
(74) *Attorney, Agent, or Firm* — Arent Fox LLP

(57) ABSTRACT

Embodiments of the invention generally relate to photovoltaic devices. In one embodiment, a method for forming a gallium arsenide based photovoltaic device includes providing a semiconductor structure, the structure including an absorber layer comprising gallium arsenide. A bypass function is provided in a p-n junction of the semiconductor structure, where under reverse-bias conditions the p-n junction breaks down in a controlled manner by a Zener breakdown effect.

8 Claims, 9 Drawing Sheets

(51) Int. Cl.
    *H01L 31/0735*     (2012.01)
    *H01L 31/0443*     (2014.01)

(52) U.S. Cl.
    CPC ...... *H01L 31/0443* (2014.12); *H01L 31/0735* (2013.01); *Y02E 10/544* (2013.01); *Y02P 70/50* (2015.11)

(56) References Cited

U.S. PATENT DOCUMENTS

| | | | |
|---|---|---|---|
| 4,997,491 | A | 3/1991 | Hokuyo et al. |
| 5,009,720 | A | 4/1991 | Hokuyo et al. |
| 5,223,043 | A | 6/1993 | Olson |
| 5,223,044 | A | 6/1993 | Asai |
| 5,248,346 | A | 9/1993 | Fraas et al. |
| 5,330,584 | A | 7/1994 | Saga et al. |
| 5,389,158 | A | 2/1995 | Fraas et al. |
| 5,580,395 | A * | 12/1996 | Yoshioka ............... H01L 31/068 136/255 |
| 5,902,417 | A | 5/1999 | Lillington et al. |
| 5,911,839 | A | 6/1999 | Tsai et al. |
| 6,278,054 | B1 | 8/2001 | Ho et al. |
| 6,316,716 | B1 | 11/2001 | Hilgrath |
| 6,552,259 | B1 | 4/2003 | Hosomi et al. |
| 7,592,538 | B2 | 9/2009 | Sharps et al. |
| 7,687,707 | B2 | 3/2010 | Meck et al. |
| 7,696,429 | B2 | 4/2010 | Strobl |
| 7,759,572 | B2 | 7/2010 | Sharps et al. |
| 8,124,870 | B2 | 2/2012 | Woods et al. |
| 2001/0017154 | A1 | 8/2001 | Washio |
| 2003/0145884 | A1 | 8/2003 | King et al. |
| 2005/0268963 | A1 | 12/2005 | Jordan et al. |
| 2006/0185582 | A1 | 8/2006 | Atwater et al. |
| 2007/0137700 | A1 | 6/2007 | Sherohman et al. |
| 2009/0078310 | A1 * | 3/2009 | Stan .................. H01L 31/06875 136/255 |
| 2009/0283848 | A1 | 11/2009 | Tan et al. |
| 2010/0096001 | A1 | 4/2010 | Sivananthan et al. |
| 2010/0108134 | A1 | 5/2010 | Ravi |
| 2010/0212729 | A1 | 8/2010 | Hsu |
| 2010/0320546 | A1 * | 12/2010 | Tamura ............. H01L 21/26506 257/408 |
| 2011/0139240 | A1 * | 6/2011 | Allenic ............. H01L 31/03529 136/256 |
| 2011/0240099 | A1 | 10/2011 | Ellinger et al. |

FOREIGN PATENT DOCUMENTS

| | | |
|---|---|---|
| JP | 2001-189483 | 7/2001 |
| JP | 2005-514763 | 5/2005 |
| WO | WO 03/054926 | 7/2003 |

OTHER PUBLICATIONS

Akeed Ahmed Pavel, et al., "Enhancing Efficiency of a Heteroface Solar Cell," Electron Devices, 2005 Spanish Conference on Tarragona, Spain Feb. 2-4, 2005.

Chinese Office Action issued in Chinese Patent Application No. 201210027952.3 dated Apr. 12, 2016.

Office Action issued in Chinese Patent Application No. 201710057541.1 dated Jul. 2, 2018 (10 pages total).

European Search Report issued in European Application No. 17198268 dated Jan. 10, 2018 (10 pages).

European communication pursuant to Article 94(3) corresponding to EP Application No. 17198268.9, dated Jul. 23, 2019.

International Search Report and Written Opinion corresponding to PCT/US2020/018028, dated May 13, 2020.

* cited by examiner

SELF-BYPASS DIODE FUNCTION FOR GALLIUM ARSENIDE PHOTOVOLTAIC DEVICES

CROSS-REFERENCE TO RELATED APPLICATIONS

The present application is a continuation of U.S. patent application Ser. No. 13/023,733 entitled "Self-Bypass Diode Function for Gallium Arsenide Photovoltaic Devices," filed on Feb. 9, 2011, now U.S. Pat. No. 9,716,196, issued on Jul. 25, 2017. The disclosure of this priority application is hereby incorporated in its entirety by reference.

BACKGROUND OF THE INVENTION

Field of the Invention

Embodiments of the invention generally relate to photovoltaic devices, such as solar cells, and methods for fabricating such photovoltaic devices.

Description of the Related Art

As fossil fuels are being depleted at ever-increasing rates, the need for alternative energy sources is becoming more and more apparent. Energy derived from wind, from the sun, and from flowing water offer renewable, environment-friendly alternatives to fossil fuels, such as coal, oil, and natural gas. Being readily available almost anywhere on Earth, solar energy is becoming a viable alternative.

To harness energy from the sun, the junction of a solar cell absorbs photons to produce electron-hole pairs, which are separated by the internal electric field of the junction to generate a voltage, thereby converting light energy to electric energy. The generated voltage can be increased by connecting solar cells in series, and the current may be increased by connecting solar cells in parallel. Solar cells may be grouped together in modules on solar panels. An inverter may be coupled to several solar panels to convert DC power to AC power.

One issue with the use of photovoltaic devices such as solar panels is the problem of shading on portions of the solar panel. As shown in FIG. 1, solar panels include multiple photovoltaic cells 10 connected in series in a string in each module to provide increased power and voltage from sunlight. However, a portion of these cells may get shaded from sunlight during operation, which affects the performance of the entire string or module. For example, the cell 12 is shaded from sunlight by an obstruction while the other cells 10 are not. A series mismatch occurs when the electrical parameters of one solar cell are significantly altered from those of the other cells. Since the current through the cells must be the same, the overall current from the combination cannot exceed that of the shaded cell. At low voltages, when one solar cell is shaded while the remainder in the string or module are not, the current being generated by the unshaded solar cells may be dissipated in the shaded cell rather than powering the load. Thus, in a series connected configuration with current mismatch, severe power reductions can occur if the poor cell produces less current. If the configuration is operated at short circuit or low voltages, the highly localized power dissipation in the shaded cell can cause local "hot spot" heating, avalanche breakdown, and irreversible damage to one or more of the solar cells and to the module.

One solution to the effects of mismatch from shading on some solar cells is to use one or more bypass diodes. Solar cells that intrinsically have a very high breakdown voltage or low shunt resistance may not need bypass diodes, but many other types including high performance solar cells such as gallium arsenide (GaAs) solar cells, may need the bypass function. For example, as shown in FIG. 2, typically one or more bypass diodes 14 are connected in parallel and with opposite polarity to solar cell circuits 16. To reduce costs, a bypass diode is usually placed across a group of solar cells. In normal (unshaded) operation, each solar cell 16a is forward biased and the bypass diode 14a is reverse biased and is an open circuit. If one or more of the solar cells 16b become shaded, those cells 16b are reverse biased due to the mismatch in short-circuit current between series connected cells, and the bypass diode 14b is forward biased and conducts current, which allows the current from the unshaded solar cells to flow in an external circuit rather than forward biasing each unshaded cell. The maximum reverse bias across the shaded cell is reduced to about a single diode drop, limiting the current and preventing hot-spot heating and damage to the solar cells.

Although bypass diodes are effective in reducing the destructive effects of mismatches in solar cells due to shading, they are an additional component that must be fabricated for solar cells and thus add to the cost and time of production of solar panels. Furthermore, the bypass diodes must be integrated into a solar cell design, which may be complex and difficult to accomplish. These factors add to the currently higher cost of producing solar cells, may reduce the capability of solar cells in becoming a mainstream energy source, and may limit the applications to which solar cells may be suited.

Accordingly, there is a need for increased efficiency and production compatible methods for providing bypass diode functionality in photovoltaic devices.

SUMMARY OF THE INVENTION

Embodiments of the invention generally relate to photovoltaic devices such as solar cells, and more specifically, to a bypass diode function in photovoltaic devices.

In one embodiment, a method for forming a gallium arsenide based photovoltaic device includes providing a semiconductor structure, the structure including an absorber layer comprising gallium arsenide. A bypass function is provided in a p-n junction of the semiconductor structure, where under reverse-bias conditions the p-n junction breaks down in a controlled manner by a Zener breakdown effect.

Some embodiments of the method can include various features. For example, the p-n junction can break down by the Zener breakdown effect in an electric field having less magnitude than an electric field causing avalanche breakdown of the p-n junction. The bypass function can be intrinsic to the p-n junction of the photovoltaic device such that the photovoltaic device provides the bypass function with no distinct bypass diode connected to or included in the photovoltaic device. The absorber layer can be highly doped at about $4 \times 10^{17}$ cm$^{-3}$ or greater. An emitter layer can be formed in the semiconductor structure, the emitter layer being made of a different material than and having a higher bandgap than the absorber layer, where a heterojunction is formed between the emitter layer and the absorber layer. An intermediate layer can be formed between the absorber layer and the emitter layer, where a p-n junction is formed at a location offset from the heterojunction. The intermediate layer can be doped at less concentration than the absorber layer.

In another embodiment, a gallium arsenide based photovoltaic device includes a semiconductor structure including an absorber layer comprising gallium arsenide, and a p-n junction within the semiconductor structure, the p-n junction providing a bypass function wherein under reverse-bias conditions the p-n junction breaks down in a controlled manner by a Zener breakdown effect.

The embodiments of photovoltaic devices described herein provide a bypass function in a gallium arsenide photovoltaic cell to allow bypass current to flow in mismatched conditions such as shading of some cells in a series string. This self-bypass functionality allows protection of cells while avoiding the need for separate or distinct bypass diodes to be connected to the cells. Such innovations can allow for greater efficiency and flexibility in resulting photovoltaic devices and in forming such when compared to conventional solar cell fabrication processes.

DETAILED DESCRIPTION

Embodiments of the invention generally relate to photovoltaic devices and processes, and more specifically to photovoltaic cells and the fabrication processes for forming such photovoltaic cells. The following description is presented to enable one of ordinary skill in the art to make and use the inventions and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Embodiments of photovoltaic devices described herein provide a bypass function in a photovoltaic cell to allow bypass current to flow in mismatched conditions, such as shading of some solar cells in a series string. The self-bypass functionality provided in gallium arsenide photovoltaic devices allows protection of the devices while avoiding the need for separate or distinct bypass diodes to be connected to the devices. Such innovations can allow for greater efficiency and flexibility in forming photovoltaic devices when compared to conventional solar cell fabrication processes.

Gallium arsenide solar cells are high-performing photovoltaic devices that typically are connected with separate bypass diodes in order to protect the solar cells from mismatches in current when the cells are integrated into a solar panel, e.g., caused by shading some of the solar cells in a series while not shading others. Providing separate bypass diodes, however, adds to the cost and time fabrication of the solar panels, and the integration of diodes creates additional complexity. In addition, some high performance solar cells have a higher operating voltage per cell than other types of solar cells, requiring more bypass diodes than these other types. The embodiments herein allow the functionality of a bypass diode to be included in a high-performance, GaAs solar cell without having to fabricate or provide a separate bypass diode connected to the solar cells.

Doping concentrations are referred to in the descriptions of semiconductor device embodiments. Herein, "doping concentration" refers to the concentration of active dopant in a material, i.e., the majority carrier concentration.

Figure 3:
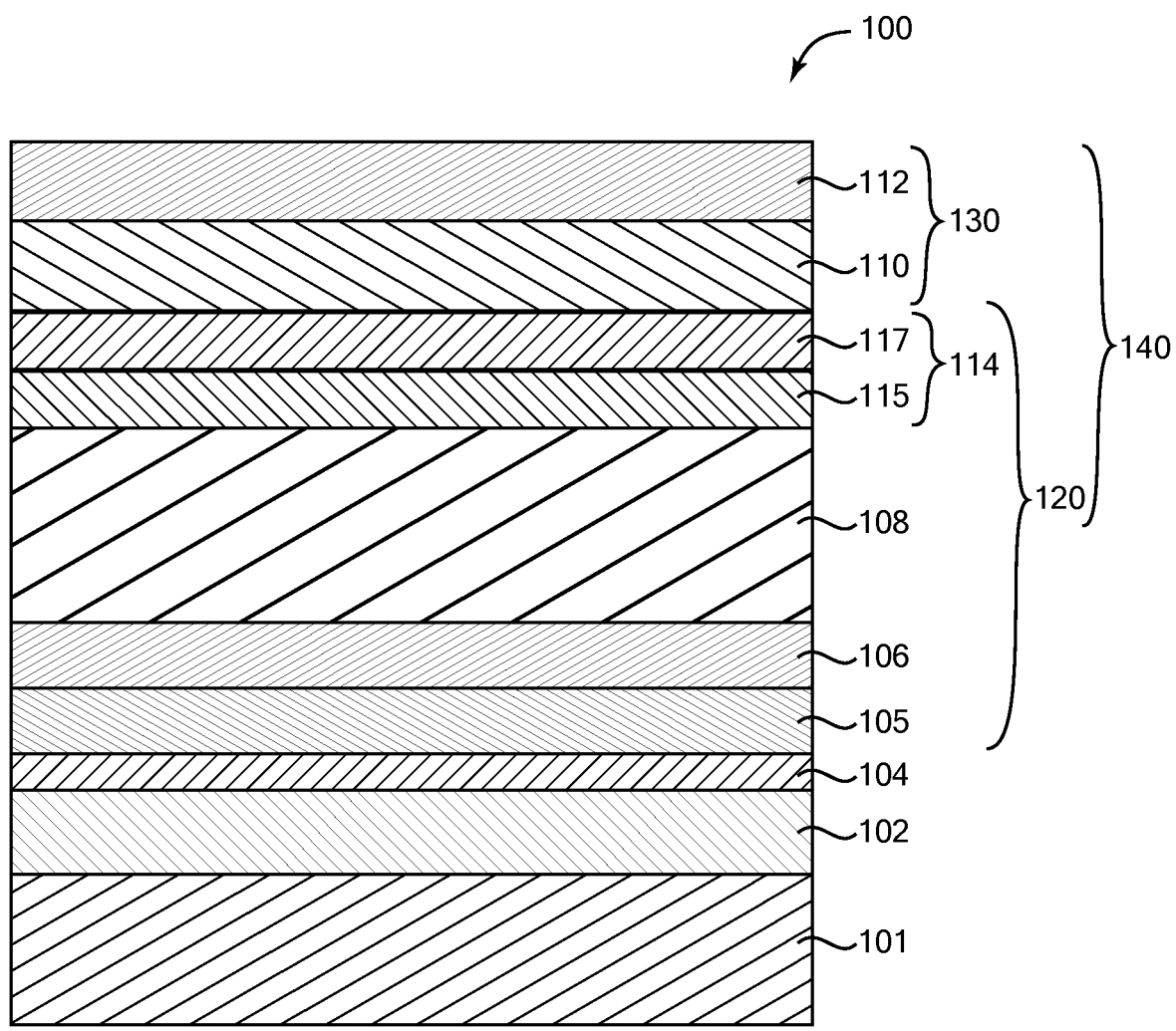
FIG. 3 is a cross sectional view of a photovoltaic unit in accordance with some embodiments described herein.
Figure 4:
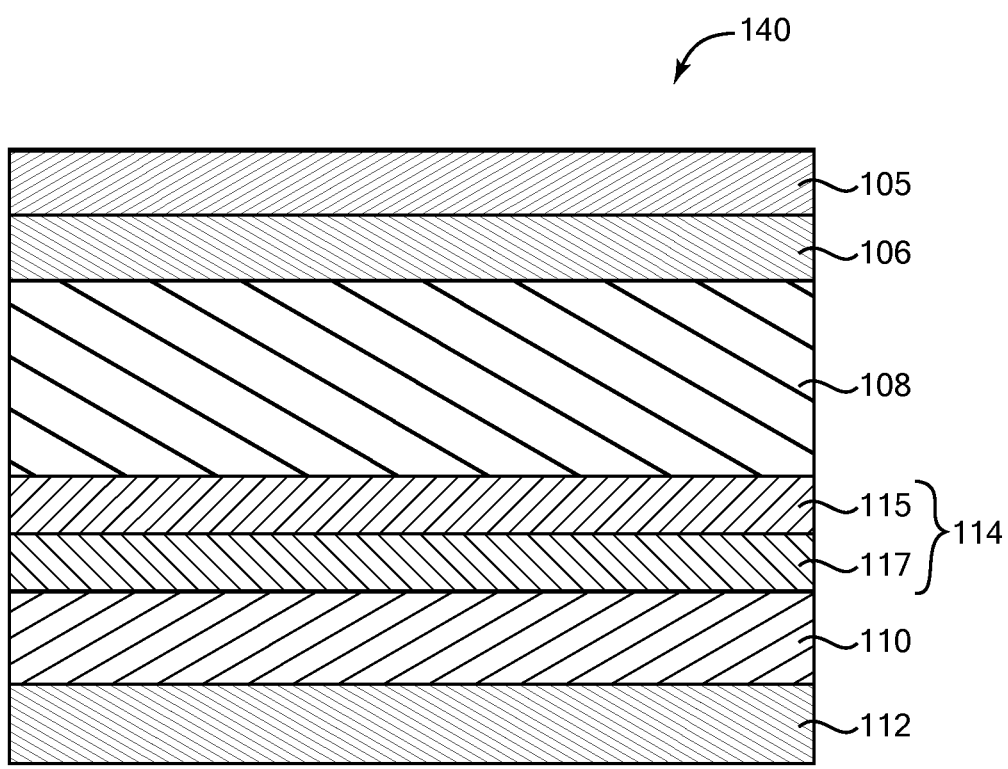
FIG. 4 depicts a cross-sectional view of a semiconductor structure formed from the unit of FIG. 3 to form a photovoltaic cell in accordance with some embodiments described herein.

FIG. 3 illustrates a cross-sectional view of a photovoltaic unit 100 containing a gallium arsenide based cell 140 coupled with a growth wafer 101 by a sacrificial layer 104 disposed therebetween. FIG. 4 illustrates a cross-sectional view of a semiconductor structure resulting from the photovoltaic unit 100, in the form of a gallium arsenide based photovoltaic cell 140. Multiple layers of epitaxial materials containing varying compositions are deposited within the photovoltaic unit 100 including the buffer layer 102, the sacrificial layer 104, as well as many of the layers contained within the gallium arsenide based cell 140. The various layers of epitaxial materials may be grown or otherwise formed by deposition process such as a chemical vapor deposition (CVD) process, a metal organic CVD (MOCVD) process, or a molecular beam epitaxy (MBE) process.

In another embodiment described herein, the photovoltaic unit 100 may be exposed to a wet etch solution in order to etch the sacrificial layer 104 and to separate the gallium arsenide based cell 140 from the growth wafer 101 during an epitaxial lift off (ELO) process. The wet etch solution generally contains hydrofluoric acid, and may also contain various additives, buffers, and/or surfactants. The wet etch solution selectively etches the sacrificial layer 104 while preserving the gallium arsenide based cell 140 and the growth wafer 101. Once separated, the gallium arsenide based cell 140, as depicted in FIG. 4, may be further processed to form a variety of photovoltaic devices, including photovoltaic cells and modules, as described by several embodiments herein.

In some embodiments, the epitaxially grown layers may be formed by growing Group III-V materials during a high growth rate vapor deposition process, e.g., growth rates of greater than 5 μm/hr, such as about 10-120 μm/hr or greater. Other embodiments can use a lower growth rate process to form the layers. The Group III-V materials are thin films of epitaxially grown layers which contain gallium arsenide, aluminum gallium arsenide, aluminum gallium indium phosphide, aluminum indium phosphide, aluminum arsenide, or combinations thereof.

In some embodiments, the process of forming unit 100 includes heating a wafer to a deposition temperature of about 550° C. or greater (or other ranges), within a processing system, exposing the wafer to a deposition gas containing a chemical precursor, such as gallium precursor gas and arsine for a gallium arsenide deposition process, and depositing a layer containing gallium arsenide on the wafer. The high growth rate deposition process may be utilized to deposit a variety of materials, including gallium arsenide, aluminum gallium arsenide, aluminum gallium phosphide, aluminum gallium indium phosphide, aluminum indium phosphide, aluminum arsenide, alloys thereof, dopant variants thereof, or combinations thereof. In one embodiment, a deposition gas may be formed by combining or mixing two, three, or more chemical precursors within a gas manifold prior to entering or passing through the showerhead, or formed by combining or mixing two, three, or more chemical precursors within a reaction zone after passing through the showerhead. The deposition gas may contain one or multiple chemical precursors of gallium, aluminum, indium, arsenic, phosphorus, or others. The deposition gas can also contain one, two or more carrier gases, which can also be combined or mixed with the precursor gases prior to or subsequent to passing through the showerhead. For example, the carrier gas may contain hydrogen ($H_2$), nitrogen ($N_2$), a mixture of hydrogen and nitrogen, argon, helium, or combinations thereof.

The deposition processes for depositing or forming Group III-V materials, as described herein, may be conducted in any of a variety of types of deposition chambers.

In one embodiment, one or more buffer layers 102 may be formed on the growth wafer 101 in order to start forming the photovoltaic unit 100. The growth wafer 101 may contain an n-type, p-type, or semi-insulating material, and may contain the same or similar material as the one or more subsequently deposited buffer layers. For example, the growth wafer 101 may contain gallium arsenide, or n-doped gallium arsenide, when creating a gallium arsenide, or n-doped gallium arsenide, buffer layer. The p-dopants may be selected from carbon, magnesium, zinc, or combinations thereof while the n-dopants may be selected from silicon, selenium, tellurium, or combinations thereof. In some embodiments, p-type dopant precursors may include carbon tetrabromide ($CBr_4$) for a carbon dopant, bis(cyclopentadienyl)magnesium ($Cp_2Mg$) for a magnesium dopant, and dialkyl zinc compounds including dimethylzinc or diethylzinc for a zinc dopant. In other embodiments, n-type dopant precursors may include silane ($SiH_4$) or disilane ($Si_2H_6$) for a silicon dopant, hydrogen selenide ($H_2Se$) for a selenium dopant, and dialkyl tellurium compounds including dimethyltellurium, diethyltellurium, and diisopropyltellurium for a tellurium dopant.

The buffer layer 102 or layers may provide an intermediary between the growth wafer 101 and the semiconductor layers of the final photovoltaic unit that can accommodate their different crystallographic structures as the various epitaxial layers are formed. The one or more buffer layers 102 may be deposited to a thickness from about 100 nm to about 600 nm, such as a thickness of about 500 nm, for example. Each of the one or more buffer layers 102 may contain a Group III-V compound semiconductor, such as gallium arsenide, depending on the desired composition of the final photovoltaic unit. The buffer layer 102 may also be doped, such as an n-doped material, for example n-doped gallium arsenide.

A sacrificial layer 104 may be deposited on the buffer layer 102. The sacrificial layer 104 may contain a suitable material, such as aluminum arsenide or an aluminum arsenide alloy, and may be deposited to have a thickness within a range from about 3 nm to about 100 nm, such as from about 5 nm to about 30 nm, for example, about 20 nm. The sacrificial layer 104 may also be doped, such as an n-doped material, for example n-doped aluminum arsenide. The sacrificial layer 104, also known as the release layer, is etched and removed while separating the gallium arsenide based cell 140 from the growth wafer 101 during the ELO process. Prior to being etched, the sacrificial layer 104 is also utilized to form the lattice structure for the subsequently and epitaxially grown layers contained within the gallium arsenide based cell 140, such as the n-type contact layer 105.

The gallium arsenide based cell 140 includes an n-type film stack 120 containing n-doped gallium arsenide materials disposed over a p-type film stack 130 which contain p-doped gallium arsenide materials. Each of the n-type film stack 120 and the p-type film stack 130 independently contains multiple layers of varying compositions of materials including gallium arsenide materials. In some embodiments, the n-type film stack 120 includes an n-type contact layer 105, an n-type front window 106, an n-type absorber layer 108 formed adjacent the n-type front window 106. The p-type film stack 130 includes a p-type emitter layer 110 and a p-type contact layer 204 formed on the p-type emitter layer 110. A back metal layer 204 can be formed on the contact layer 112. In other embodiments, a p-type film stack can be disposed over an n-type film stack in cell 140.

During a fabrication process, as described in one embodiment, the n-type contact layer 105, or interface layer, may be deposited on the sacrificial layer 104. The n-type contact layer 105 contains Group III-V materials, such as gallium arsenide, depending on the desired composition of the final photovoltaic unit. The n-type contact layer 105 is n-doped, and for some embodiments, the doping concentration may be within a range greater than about $1 \times 10^{18}$ $cm^{-3}$, such as greater than $5 \times 10^{18}$ $cm^{-3}$, for example, from greater than about $1 \times 10^{18}$ $cm^{-3}$ to about $1 \times 10^{19}$ $cm^{-3}$. The n-type contact layer 105 may be formed at a thickness within a range from about 10 nm to about 1,000 nm or from about 10 nm to about 100 nm, such as from about 25 nm to about 75 nm, for example, about 50 nm. The n-type contact layer 105 may be formed at this stage, such as a part of the gallium arsenide based cell 140 prior to the ELO process. Alternatively, in another embodiment, the n-type contact layer 105 may be formed at a later stage subsequent to the ELO process. One advantage to forming the n-type contact layer 105 as a part of the gallium arsenide based cell 140 prior to the ELO process is that the n-type contact layer 105 helps to protect the n-type front window 106 from undesired damage or material contamination during subsequent processing steps, such as while etching the sacrificial layer 104 during the ELO process.

A front window 106, also known as a passivation layer, may be formed on the sacrificial layer 104, or if present, on the optional contact layer 105. The front window 106 may contain a Group III-V material such as aluminum gallium, aluminum gallium arsenide, alloys thereof, or combinations thereof. The window layer may also or alternatively contain additional materials including aluminum gallium indium phosphide, aluminum indium phosphide, alloys thereof, derivatives thereof, or combinations thereof. These aluminum gallium indium phosphide compounds provide for a large band gap, such as about 2.2 eV or larger, as well as high collector efficiency at shorter wavelengths when utilized within the n-type front window 106.

For example, the front window 106 material may be n-doped in some embodiments, and the doping concentration may be within a range greater than about $1 \times 10^{18}$ cm$^{-3}$, such as greater than to $3 \times 10^{18}$ cm$^{-3}$, for example, from greater than about $1 \times 10^{18}$ cm$^{-3}$ to about $1 \times 10^{18}$ cm$^{-3}$. The front window 106 material may be non-doped in other embodiments. The aluminum gallium arsenide may have the formula of molar ratios, the Al$_x$Ga$_{1-x}$As, for example, a molar ratio of Al$_{0.3}$Ga$_{0.7}$As. The front window 106 may be deposited to have a thickness within a range from about 5 nm to about 75 nm, for example, from about 20 nm to about 40 nm. The front window 106 may be transparent to allow photons to pass through the front window 106 on the front side of the gallium arsenide based cell 140 to other underlying layers.

A p-n junction is formed between an absorber layer 108 and an emitter layer 110. In some embodiments, both absorber and emitter layers of the p-n junction include semiconductors that are heavily doped. This forms an effective Zener diode that provides a band-to-band tunneling effect when the p-n junction is reverse-biased. The electrical field causing the Zener effect is less than the avalanche breakdown threshold of the p-n junction. This effect is described in greater detail below.

The absorber layer 108 of the p-n junction may be formed on the front window 106. The absorber layer 108 may contain a Group III-V compound semiconductor, such as gallium arsenide (GaAs). In some embodiments, the absorber layer 108 can be monocrystalline. The absorber layer 108 can, for example, have only one type of doping, for example, n-doping. The use of gallium arsenide is advantageous for many types of photovoltaic devices, including solar cells. For example, the bandgap of GaAs provides a good match to the solar spectrum, such that a GaAs absorber layer provides a good balance between voltage and current generation in the range of frequencies of light absorbed by solar cells as compared to other materials.

To achieve the self-bypass diode functionality in the photovoltaic device as described in the embodiments herein, the doping concentration of the absorber layer 108 is very high relative to the usual doping concentrations. For example, in an embodiment where absorber layer 108 is n-doped, the n-dopant concentration can be within a range from about $4 \times 10^{17}$ cm$^{-3}$ to about $1 \times 10^{19}$ cm$^{-3}$. The thickness of the n-type absorber layer 108 may be within a range from about 300 nm to about 3,500 nm, such as from about 1,000 nm to about 2,000 nm (about 1.0 μm to about 2.0 μm), for example, 2,000 nm. In some embodiments, the absorber layer is less than 1 μm, for example, an n-type absorber layer 108 may have a thickness of about 800 nm or less, such as about 500 nm or less, such as within a range from about 100 nm to about 500 nm. This thinness provides a reduced or negligible limitation of carrier collection due to short carrier lifetime, caused by the high doping concentration, since the solar cell is thin and can collect carriers easily.

Other materials can be used in other embodiments for the absorber layer 108 and achieve the self-bypass diode functionality described herein. For example, a material with an absorption coefficient sufficiently high, such as Group III-V material, a phosphide (indium gallium phosphide (InGaP), aluminum indium phosphide (AlInP), aluminum indium gallium phosphide (AlInGaP)), indium gallium nitride, aluminum gallium arsenide, or combinations thereof.

A photovoltaic unit 100 can in some embodiments have a significantly thin absorber layer (for example, less than 500 nm) compared to conventional solar units, which may be several micrometers thick. The thickness of the absorber layer is proportional to dark current levels in the photovoltaic unit (e.g., the thinner the absorber layer, the lower the dark current). Dark current is the small electric current that flows through the photovoltaic unit or other similar photosensitive device, for example, a photodiode, even when no photons are entering the device. This background current may be present as the result of thermionic emission or other effects. Because the open circuit voltage (Voc) increases as the dark current is decreased in a photosensitive semiconductor device, a thinner absorber layer may most likely lead to a greater Voc, for a given light intensity and, thus, increased efficiency. As long as the absorber layer is able to trap light, the efficiency increases as the thickness of the absorber layer is decreased. The thin absorber layer also has an advantage with respect to carrier diffusion length. As the doping of the absorber layer is increased, the diffusion length of minority carriers may decrease, but the absorber layer can be sufficiently thin to allow the carriers to reach the p-n junction even with a decreased diffusion length.

The thinness of the absorber layer may not only be limited by the capabilities of thin film technology and ELO. For example, efficiency increases with the thinness of the absorber layer, but the absorber layer should be thick enough to carry current. However, higher doping levels may allow current to flow even in very thin absorber layers. Therefore, increased doping may be utilized to fabricate very thin absorber layers with even greater efficiency. Conventional photovoltaic devices may suffer from volume recombination effects, and therefore, such conventional devices do not employ high doping in the absorber layer. The sheet resistance of the absorber layer may also be taken into consideration when determining the appropriate thickness. Photovoltaic devices which contain a thin absorber layer can be more flexible than conventional solar cells having a thickness of several micrometers. Also, thin absorber layers can provide increased efficiency over conventional solar cells.

Fabricating a thinner base/absorber layer can in some embodiments allow use of an n-doped base/absorber layer. Other embodiments may use a p-doped base/absorber layer and an n-doped back/emitter layer. For example, the base/absorber layer may be p-doped in embodiments having a thicker absorber layer due to the diffusion length of the carriers.

The emitter layer 110 of the p-n junction can be formed adjacent the absorber layer 108 in some embodiments. The emitter layer 110 may, for example, contain a Group III-V compound semiconductor and be p-doped if the absorber layer is n-doped, or vice-versa. In some embodiments described herein, the p-type emitter layer 110 is closer than the n-type absorber layer 108 to the back side of the cell 140, i.e., the n-type absorber layer is closer to the front side of the cell 140. The emitter layer 110 may be monocrystalline.

In some embodiments the emitter layer 110 can be heavily p-doped and for some embodiments, the doping concentration of the p-doped emitter layer can be within a range from about $4 \times 10^{17}$ cm$^{-3}$ to about $1 \times 10^{20}$ cm$^{-3}$, such as about $1.5 \times 10^{18}$ cm$^{-3}$. The thickness of the emitter layer 110 may be within a range from about 100 nm to about 500 nm or greater, for example, about 300 nm.

In some embodiments, the contact of an n-type absorber layer 108 with a p-type emitter layer 110 creates a p-n junction or interface layer for absorbing photons, and the emitter layer 110 contains the same or similar material as the absorber layer 108. A p-type absorber layer 108 and n-type emitter layer 110 can also create a p-n junction.

In other embodiments, the n-type absorber layer 108 contains one material (such as gallium arsenide) and the p-type emitter layer 110 contains a different material having a different bandgap than the material of the absorber layer 108 (such as aluminum gallium arsenide), and the p-n interface is a heterojunction. Heterojunctions, as described in embodiments herein, are observed to have reduced dark current, improved voltage productions, and improved radiative recombinations as compared to homojunctions of the conventional photovoltaic materials. In some embodiments described herein, the material of the p-type emitter layer 110 has a higher bandgap than the material of the n-type absorber layer 108.

The emitter layer 110 may contain a Group III-V compound semiconductor for forming a heterojunction with the n-type absorber layer 108. For example, if an n-type absorber layer 108 contains gallium arsenide, a p-type emitter layer 110 may contain a different semiconductor material, such as aluminum gallium arsenide (AlGaAs). If the p-type emitter layer 110 and the n-type front window 106 both contain aluminum gallium arsenide, the $Al_xGa_{1-x}As$ composition of the p-type emitter layer 110 may be the same as or different than the $Al_yGa_{1-y}As$ composition of an n-type front window 106. For example, a p-type emitter layer 110 may have a molar ratio of $Al_{0.3}Ga_{0.7}As$.

In some embodiments, the heterojunction can be offset from the p-n junction by providing an intermediate layer 114 between the absorber layer 108 and the emitter layer 110. The intermediate layer 114 can provide a material transition between the absorber layer 108 and the emitter layer 110. For example, some embodiments of such an intermediate layer are described with reference to FIGS. 5 and 6 below.

In some embodiments, the depletion region of the p-n junction (whether or not there is a heterojunction) can be provided with a different doping concentration than the absorber layer and achieve the self-bypass diode functionality described herein. Such embodiments are described in greater detail below with reference to FIGS. 5 and 6.

Optionally, a contact layer 112 may be formed on the emitter layer 110. For example, a p-type contact layer 112 may contain a Group III-V compound semiconductor, such as gallium arsenide. The p-type contact layer 112 is generally monocrystalline and p-doped, and for some embodiments, the doping concentration of the p-type contact layer 112 may be greater than $1\times10^{18}$ cm$^{-3}$, such as from about $1\times10^{18}$ cm$^{-3}$ to about $2\times10^{19}$ cm$^{-3}$, for example, about $3\times10^{18}$ cm$^{-3}$. The p-type emitter layer 110 may have a thickness within a range from about 10 nm to about 100 nm, for example, about 50 nm.

Once the emitter layer 110 has been formed, cavities or recesses (not shown) may be formed in the emitter layer 110 (or optional contact layer 112) deep enough to reach the underlying base absorber layer 108. Such recesses may be formed by applying a mask to the emitter layer 110 (or optional contact layer 112) using photolithography, for example, and removing the material in the emitter layer 110 (and optional contact layer 112) not covered by the mask using a technique, such as wet or dry etching. In this manner, the absorber layer 108 may be accessed via the back side of the gallium arsenide based cell 140.

Figure 5:
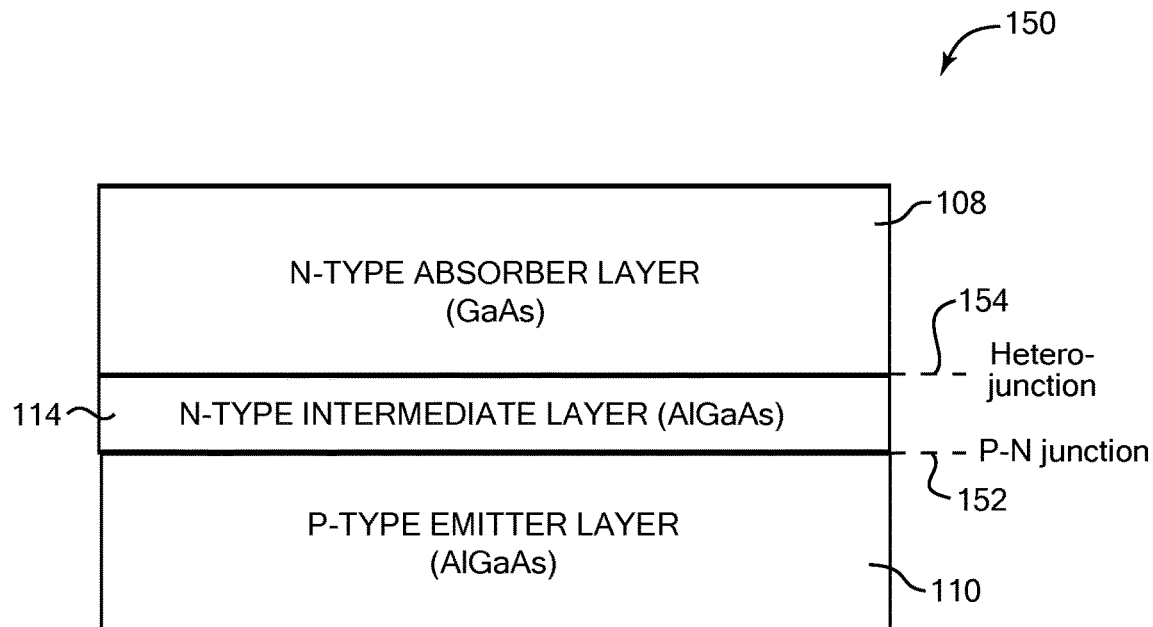
FIGS. 5-6 depict cross-sectional views of the semiconductor structure of FIG. 4 in accordance with heterojunction embodiments described herein.
Figure 6:
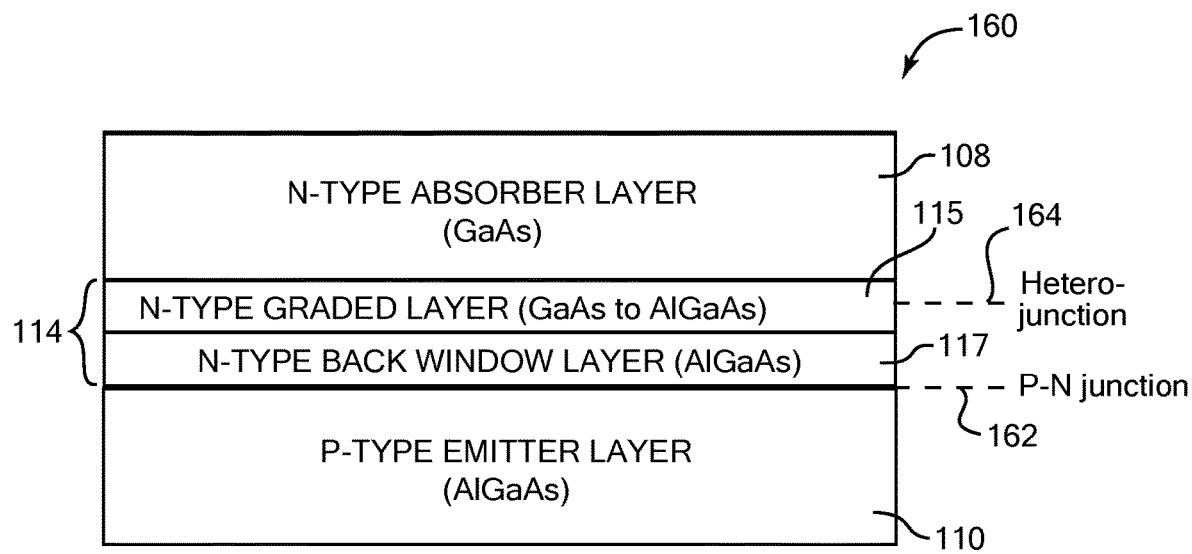

FIGS. 5 and 6 are cross-sectional views of embodiments of the photovoltaic cell 140 in which a heterojunction is offset from a p-n junction.

FIG. 5 shows a portion of one embodiment 150 of cell 140 including absorber layer 108, an intermediate layer 114, and emitter layer 110. In some embodiments, the intermediate layer 114 contains the same or substantially the same material as the emitter layer 110, e.g., such as aluminum gallium arsenide in embodiments in which the emitter layer 110 contains aluminum gallium arsenide. In addition, the intermediate layer 114 has the same type of doping as the absorber layer 108, e.g., n-type doping. In some embodiments the intermediate layer 114 can have a thickness of about two depletion lengths, where a depletion length is the width of the depletion region formed around the p-n junction. For example, in some embodiments the intermediate layer 114 can have a thickness in the range of about 0 to 200 nm.

This embodiment of the cell 140 provides a structure that allows the p-n junction that generates voltage for the cell to be offset from the heterojunction provided by materials having different bandgaps. For example, the p-n junction 152 is at the interface between the n-type and p-type materials of the emitter layer 110 and the intermediate layer 114. Thus, in one described embodiment, the p-n junction is provided at least partially within the higher-bandgap material of which the emitter layer 110 and intermediate layer 114 are composed (e.g., AlGaAs), and the heterojunction 122 is located at the interface between the intermediate layer 114 and the absorber layer 108 (e.g., the interface between GaAs and AlGaAs). This offset provides some advantages over a coincident p-n junction and heterojunction. For example, the offset p-n junction provided between the AlGaAs layers can reduce the dark current of the device. In some embodiments, a majority of the absorber layer 108 is outside of a depletion region formed by the p-n junction.

In some embodiments, the heterojunction 154 is located within two depletion lengths of the p-n junction 152. For example, a depletion region may be about 1000 Å (100 nm) wide in some embodiments. The depletion region typically still has a depletion effect past this region, within about two depletion region widths (depletion lengths) of the p-n junction. A heterojunction located further than this distance from the p-n junction may not allow the depletion effect to span the heterojunction interface and a barrier may thus exist.

The intermediate layer can in some embodiments be doped with the same or substantially the same doping concentrations as the absorber layer 108. This allows the self-bypass functionality described herein. For example, the intermediate layer can have the formula of molar ratios of $Al_xGa_{1-x}As$, for example a molar ratio of $Al_{0.3}Ga_{0.7}As$, and be n-doped within a range from about $4\times10^{17}$ cm$^{-3}$ or greater.

In other embodiments, the intermediate layer 114, or a portion of the intermediate layer, can have a different doping concentration than the absorber layer 108 and emitter layer 110. For example, the intermediate layer 114 can have a lower doping concentration of $5\times10^{16}$ cm$^{-3}$ or greater, such as $1\times10^{17}$ cm$^{-3}$, as compared to the much higher doping concentration of the absorber layer 108 of $4\times10^{17}$ cm$^{-3}$ or greater. In general, the depletion region of the p-n junction can have a lower doping concentration than the absorber layer 108. In such embodiments, the cell 200 retains the self-bypass diode functionality (explained in greater detail below) despite the lower doping concentrations of the depletion region and/or intermediate layer 114, because the p-n junction which provides the self-bypass function has a depletion region that extends across the intermediate layer's thickness. This feature can allow the p-n junction and heterojunction to be designed without having to take into account the high doping level needed to obtain the self-bypass diode functionality. Otherwise, in some embodiments the high doping in the depletion region of the absorber layer 108 could impact the operation of the p-n junction, such as increasing the carrier recombination rate.

FIG. 6 illustrates another embodiment 160 of the intermediate layer 114, in which the intermediate layer 114 includes a graded layer 115 and a back window layer 117 disposed between the absorber layer 108 and the emitter layer 110. The p-n junction 162 is offset from the heterojunction 164 provided between two materials having different bandgaps. For example, an n-type graded layer 115 can be formed over the n-type absorber layer 108 and an n-type back window 117 can be formed over the n-type graded layer 115, prior to forming the p-type emitter layer 110 over n-type back window 117. The embodiment of 160 includes a p-n junction 162 formed between the n-doped layer 117 and the p-doped layer 110. In this example, the materials are GaAs in absorber layer 108 and AlGaAs in the graded layer 115. Although the heterojunction 164 is shown in FIG. 6 for illustrative purposes at a midpoint in the graded layer, due to the material gradation the heterojunction may be at any point within the layer 115 or the entire width of the layer may be considered the heterojunction. As in the embodiment of FIG. 5, the p-n junction is preferably offset from the heterojunction within two depletion lengths.

The graded layer 115 may be a graded layer that includes a material gradation ranging from the absorber layer to the back window 117, where the gradation ranges from the material of the absorber layer at the graded layer side closer to the absorber layer, to the material of the back window 117 at the side closer to the back window. Thus, using the example materials described above, the gradation material may start as gallium arsenide adjacent the n-type absorber layer 108, and have a gradation in the direction of the back window of an increasing amount of aluminum and a decreasing amount of GaAs, such that the gradation ends adjacent the n-type back window 117 with about the same aluminum gallium arsenide material (molar ratios) as the material of back window 117. In many examples, the aluminum gallium arsenide at the window end of the gradation may have the formula of molar ratios, $Al_xGa_{1-x}As$, for example, a molar ratio of $Al_{0.3}Ga_{0.7}As$ can be used. The gradation of the graded layer 115 may be parabolic, exponential or linear in gradation, and/or other gradation schemes could also be used. The n-type back window 117 may also contain aluminum gallium arsenide and may have the formula of molar ratios, the $Al_xGa_{1-x}As$, for example, a molar ratio of $Al_{0.3}Ga_{0.7}As$. In other embodiments, the intermediate layer 114 contains only the graded layer 115, or the intermediate layer 114 contains only the non-graded back window 117 (as shown in FIG. 5).

Each of the graded layer 115 and the n-type back window 117 may be n-doped. For some embodiments, the doping concentration may be the same or substantially the same as the n-type absorber layer 108. In other embodiments, the doping concentration of the graded layer 115 and/or back window 117 can be less than the concentration of the absorber layer 108, similarly as described above for the intermediate layer 114 with respect to FIG. 5. For example, the doping concentration of the graded layer 115 and back window 117 can be about $1\times10^{17}$ cm$^{-3}$ while the doping concentration of the absorber layer 108 is about $4\times10^{17}$ cm$^{-3}$.

The thicknesses of the graded layer 115 and the back window 117 can vary widely in different embodiments, while the entire intermediate layer 114 can maintain a standard thickness (e.g., less than about 2 depletion lengths, such as in the range of 0 to 200 nm in some embodiments).

The presence of the graded layer 115 can help to reduce barrier effects of an interface between the AlGaAs and GaAs layers, in one example. The back window 117 can also provide passivation to reduce recombination at the surface of the absorber layer 108.

Embodiments suitable for the intermediate layer and other heterojunction characteristics are described in copending U.S. patent application Ser. No. 12/939,077, filed on Nov. 3, 2010, entitled, "Optoelectronic Devices Including Heterojunction," and incorporated herein by reference in its entirety.

Figure 1:
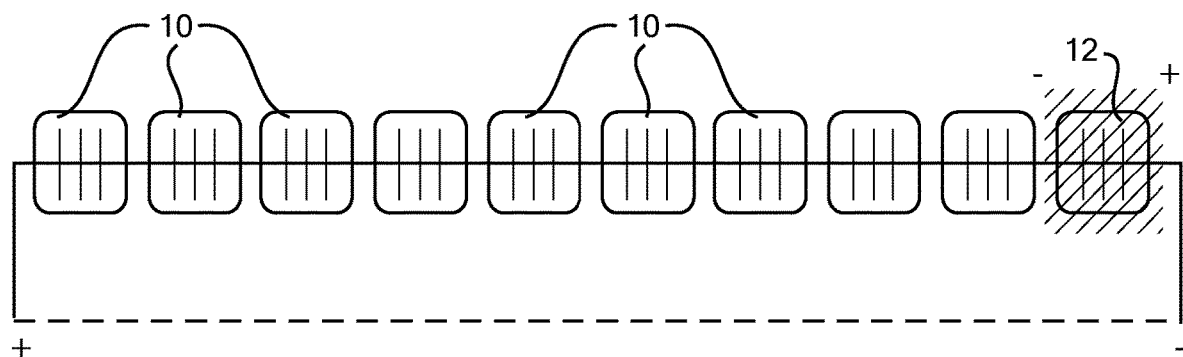
FIG. 1 is a diagrammatic illustration of a series of connected solar cells in a solar cell module including a shaded solar cell.
Figure 2:
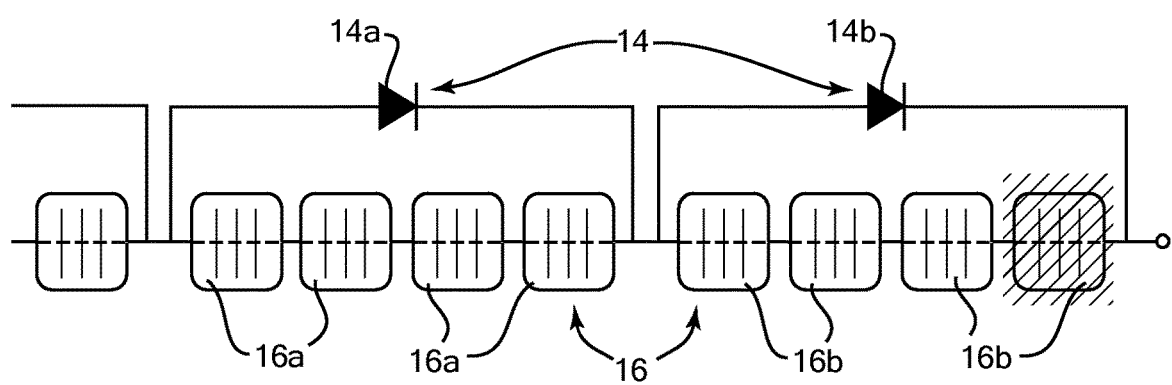
FIG. 2 is a diagrammatic illustration of a series of connected solar cells having discrete bypass diodes connected in parallel.
Figure 7:
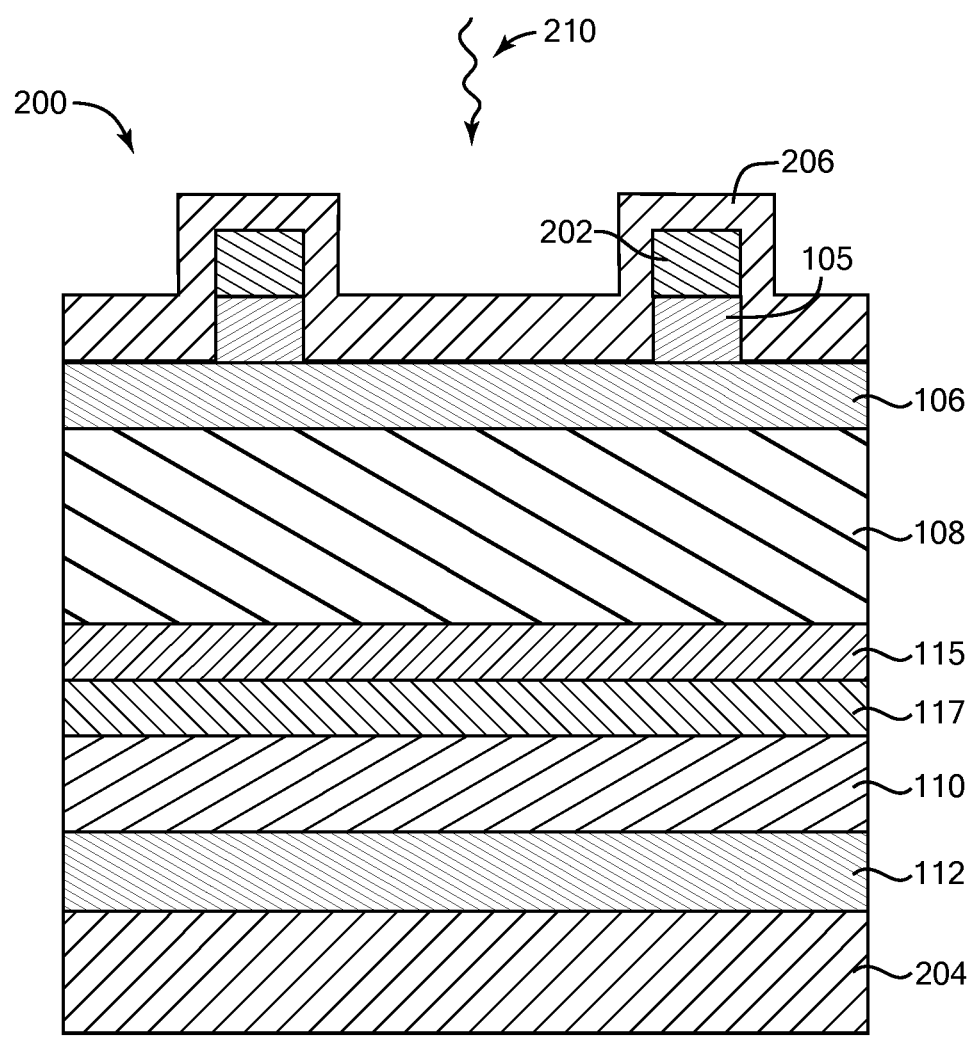
FIG. 7 depicts a cross-sectional view of a two-sided photovoltaic cell in accordance with some embodiments described herein.

FIG. 7 is a cross-sectional view of one embodiment of a photovoltaic cell 200 suitable for use with the present invention, in which a metal contact layer 202 and anti-reflective coating 206 have been formed on the front side of the cell 140. In some embodiments, photovoltaic cell 200 is formed by the ELO process used on the gallium arsenide based photovoltaic unit 100 as described above with reference to FIGS. 1 and 2.

As shown in FIG. 7, the cell 200 can in some embodiments be a two-sided photovoltaic device and can include a front metal contact layer 202 and a back metal contact layer 204 disposed on opposite sides of photovoltaic cell 140. The front metal contact layer 202 is disposed on the front side or sun side to receive light 210 while the back metal contact layer 204 is disposed on the back side of photovoltaic cell 200. For example, in embodiments having the n-stack deposited over the p-stack, the front metal contact layer 202 can be an n-metal contact, and the back metal contact layer 204 can be a p-metal contact.

Front metal contact layer 202 can be deposited on the front contact layer 105 according to any of well-known methods. In some embodiments described herein, the n-metal contact layer 202 may be fabricated by a method such as vacuum-evaporation through a photoresist, photolithography, sputtering, screen printing, ink jet printing, electroplating or electroless plating, or merely depositing on the exposed surface of the photovoltaic cell 140 that has been partially covered with a resist mask, a wax, or another protective material. The n-metal contact layer 202 contains contact materials which are electrically conductive materials, such as metals or metal alloys. Preferably, the contact materials contained within the metal contact layer 202 do not diffuse beyond (e.g., below) the semiconductor contact layer 105, either during the metal deposition process itself, or during any of the subsequent process steps utilized during the fabrication of the photovoltaic cell 200. In some embodiments, metal contact layer 202 contains multiple layers of the same or different contact materials. The contact materials preferably have specific contact resistance of about $3\times10^{-3}$ $\Omega$-cm$^2$ or less. Preferred contact materials also have Schottky barrier heights ($\Phi_{bn}$) of about 1 eV or less at carrier concentrations of about $1\times10^{18}$ cm$^{-3}$. Suitable contact materials may include gold, copper, silver, aluminum, palladium, platinum, titanium, zirconium, nickel, chromium, tungsten, tantalum, ruthenium, zinc, germanium, palladium germanium alloy, derivatives thereof, alloys thereof, or combinations thereof.

The front metal layer 202 can be later patterned as desired to provide metal contacts. As shown in FIG. 7, the metal layer 202 and the semiconductor contact layer 105 have been patterned to form metal contacts. For example, in some embodiments, the metal contact layer 202 is deposited on the contact layer 105 and subsequently, recesses are formed through the metal contact layer 202 and the contact layer 105 to expose the front window 106 on the front side of the photovoltaic cell 200. In an alternative embodiment, recesses may be initially formed in the contact layer 105 to expose the front window 106 on the front side of the photovoltaic cell 200. Thereafter, the metal contact layer 202 may be formed on the remaining portions of the contact layer 105 while leaving exposed the front window 106. In another embodiment, contact layer 105 is not present, and metal contacts are made directly to the front window layer 106.

A back metal contact layer 204 can be deposited adjacent to the contact layer 112 (or emitter layer 110). The back metal contact 204 contains contact materials which are electrically conductive materials, such as metals or metal alloys. Preferably, the contact materials do not diffuse through other layers, such as a semiconductor layer, during any of the process steps utilized during the fabrication of the photovoltaic cell 140. The metal contact layer 204 can contain multiple layers of the same or different contact materials. The contact materials preferably have specific contact resistance of about $1 \times 10^{-1}$ $\Omega$-cm$^2$ or less. Preferred contact materials also have Schottky barrier heights ($\Phi_{bn}$) of about 1 eV or less at carrier concentrations of about $1 \times 10^{18}$ cm$^{-3}$. Suitable contact materials may include gold, copper, silver, aluminum, palladium, platinum, titanium, zirconium, nickel, chromium, tungsten, tantalum, ruthenium, zinc, germanium, palladium germanium alloy, derivatives thereof, alloys thereof, or combinations thereof.

The back metal contact layer 204 may be fabricated on the photovoltaic cell 200 by a method, such as vacuum-evaporation, photolithography, sputtering, screen printing, ink jet printing, electroplating or electroless plating, or merely depositing on the exposed surface of the photovoltaic cell 200 that has been partially covered with a resist mask, a wax, or another protective material. Optionally, a metal protective layer, or metal adhesion layer, may be deposited on the metal contact layer 204 which contains a material including nickel, chromium, titanium, alloys thereof, or combinations thereof. The metal adhesion layer preferably exhibits good adhesion to the gallium arsenide of the contact layer 112. For example, in one example embodiment, the metal adhesion layer may be deposited to a thickness within a range from about 5 Å to about 20 Å. The metal protective layer may be deposited by an electron beam deposition process or a PVD process, also known as a sputtering process.

Some example embodiments of front metal contact layer 202, back metal contact layer 204, and other contact, adhesion, and reflector layers suitable for use with contact layers of the cell 140 are described in copending U.S. patent application Ser. No. 12/939,077, entitled, "Metallic Contacts for Photovoltaic Devices and Low-Temperature Fabrication Processes Thereof," filed on Nov. 3, 2010, and which is incorporated herein by reference. Other types, structures, and materials of metal contact layers can also be used with cell 200.

An anti-reflective coating (ARC) layer 206 can be disposed over the exposed front window 106, as well as the semiconductor contact layer 105 and the front metal contact layer 202. The ARC layer contains a material, or materials, that allows light to pass through while preventing light reflection from the surface of the ARC layer. For example, the ARC layer may contain magnesium fluoride, zinc sulfide, titanium oxide, silicon oxide, silicon nitride, derivatives thereof, or combination thereof. The ARC layer may be applied to the front window 106 by a technique, such as sputtering, electron-beam evaporation, or chemical vapor deposition. The ARC layer may have a thickness within a range from about 25 nm to about 200 nm, such as from about 50 nm to about 150 nm.

For some embodiments, the front window 106, the emitter layer 110, and/or the back contact layer 112 may be roughened or textured before applying the ARC layer. Each of the front window 106, the emitter layer 110, and/or the contact layer 112 may be roughened by an etching process, such as a wet etching process or a dry etching process. Texturing may be achieved by applying small particles, such as polystyrene spheres, to the surface of the layer before applying the ARC layer. By roughening or texturing the front window 106, the emitter layer 110, and/or the back contact layer 112, different angles are provided at the interface between the layer and the adjacent layer, which may have different indices of refraction. Roughening or texturing the front window 106, the emitter layer 110, and/or the back contact layer 112 may provide increased trapping of light.

In some embodiments, the front window 106 may contain multiple window layers. For these embodiments, the outermost window layer (e.g., the window layer closest to the front side of the photovoltaic cell 140) may be roughened or textured as described above before the ARC layer is applied. In one embodiment, the front window 106 contains a first window layer (not shown) disposed adjacent to the absorber layer 108 and a second window layer (not shown) interposed between the first window layer and the ARC layer. The first and second window layers may contain any material suitable for the front window 106 as described above, such as aluminum gallium arsenide, or aluminum gallium indium phosphide, but typically with different compositions. For example, the first window layer may contain $Al_{0.3}Ga_{0.2}In_{0.5}P$, and the second window layer may contain $Al_{0.4}Ga_{0.1}In_{0.5}P$. Furthermore, some of the multiple window layers may be doped, while others are undoped for some embodiments. For example, the first window layer may be doped, and the second window layer may be undoped.

In some embodiments, an adhesive layer can be formed adjacent to the back metal contact layer 204. The adhesive layer can provide good adhesion to the adjacent material of the back contact layer and provides adhesion of the cell 200 to a backing that can be placed adjacent to the adhesive layer. The backing can provide additional strength to an array of solar cells or a solar panel including cell 200 and can provide protection to the cell 200. The backing material can be glass, polymer/plastic, or other material such as metal, a composite material, etc.

In other embodiments, the opposite type of doping can be used in the layers discussed above, and/or other materials can be used that can provide the described p-n junction. Furthermore, in other embodiments the layers can be deposited or formed in a different order than the order described above. Other embodiments can provide different materials, layers, doping, thicknesses, etc. in the cell 140 or 200.

Other types, structures, and materials of metal contact layers can also be used with cell 200. For example, the metal contact layers can all be provided on the back side of the cell 200. Once the emitter layer 110 has been formed, cavities or recesses can be formed in the emitter layer 110 (or back contact layer 112) deep enough to reach the base absorber layer 108. Such recesses may be formed by applying a mask to the emitter layer 110 (or back contact layer 112) using photolithography, for example, and removing the material in the emitter layer 110 (and back contact layer 112) not covered by the mask using a technique, such as wet or dry etching. In this manner, the absorber layer 108 may be accessed via the backside of the gallium arsenide based structure 100. Some example embodiments of such all— back contact devices are described in copending U.S. patent application Ser. No. 12/939,077, entitled, "Metallic Contacts for Photovoltaic Devices and Low-Temperature Fabrication Processes Thereof," filed on Nov. 3, 2010, and copending U.S. patent application Ser. No. 12/605,151, entitled, "Photovoltaic Device with Back Side Contacts," filed on Oct. 23, 2009, both of which are incorporated herein by reference in their entireties.

FIGS. 8-11 are graphs illustrating characteristics of an example solar cell having the bypass diode function described herein.

The p-n junction of the cell 140 or 200 is provided with heavily doped absorber layer and emitter layer semiconductors as described above to cause a Zener diode to be formed under particular conditions. The Zener breakdown effect is enabled by a band-to-band tunneling effect that occurs when the p-n junction is under sufficient reverse-bias. Provided the absorber layer and emitter layer doping levels are sufficiently high, the magnitude of the reverse bias needed to cause the Zener effect is lower than the reverse bias magnitude needed to cause avalanche breakdown, so that the Zener breakdown occurs before and instead of avalanche breakdown. This Zener breakdown is reversible and not destructive to the solar cell. An avalanche breakdown effect may also be reversible; however, due to the higher electric fields and crystal imperfections in a solar cell, diodes can suffer irreversible damage when reverse-biased close to or beyond the avalanche breakdown point, and is called hot-spot heating.

In order for band-to-band tunneling of the Zener effect to take place before avalanche breakdown, the doping of the absorber should be high as described in the embodiments above. For example, a doping greater than $4 \times 10^{17}$ cm$^3$ in the absorber layer can be used for gallium arsenide photovoltaic device embodiments. A highly-doped p-n junction solar cell has a lower semiconductor sheet resistance than solar cells having lower-doped p-n junctions. This can provide advantages; for example, the lower the sheet resistance, the greater the spacing is allowed between metal contacts on the top side of the cell, which increases the amount of non-metal area that can receive sunlight on the top of the cell.

The self-bypass diode functionality described herein prevents solar cell arrays or strings from experiencing hot spot heating or destructive avalanche breakdown of shaded (or otherwise mismatched) cells. This allows the solar cell 200 itself to achieve the protection of bypass diode functionality and avoid avalanche breakdown in shaded conditions or other similar mismatches in the solar panel. The p-n junction of the solar cell 200 includes the function of a bypass diode in reverse bias, thus avoiding the need to fabricate and connect one or more separate or distinct bypass diodes to the solar cell or cells.

Figure 8:
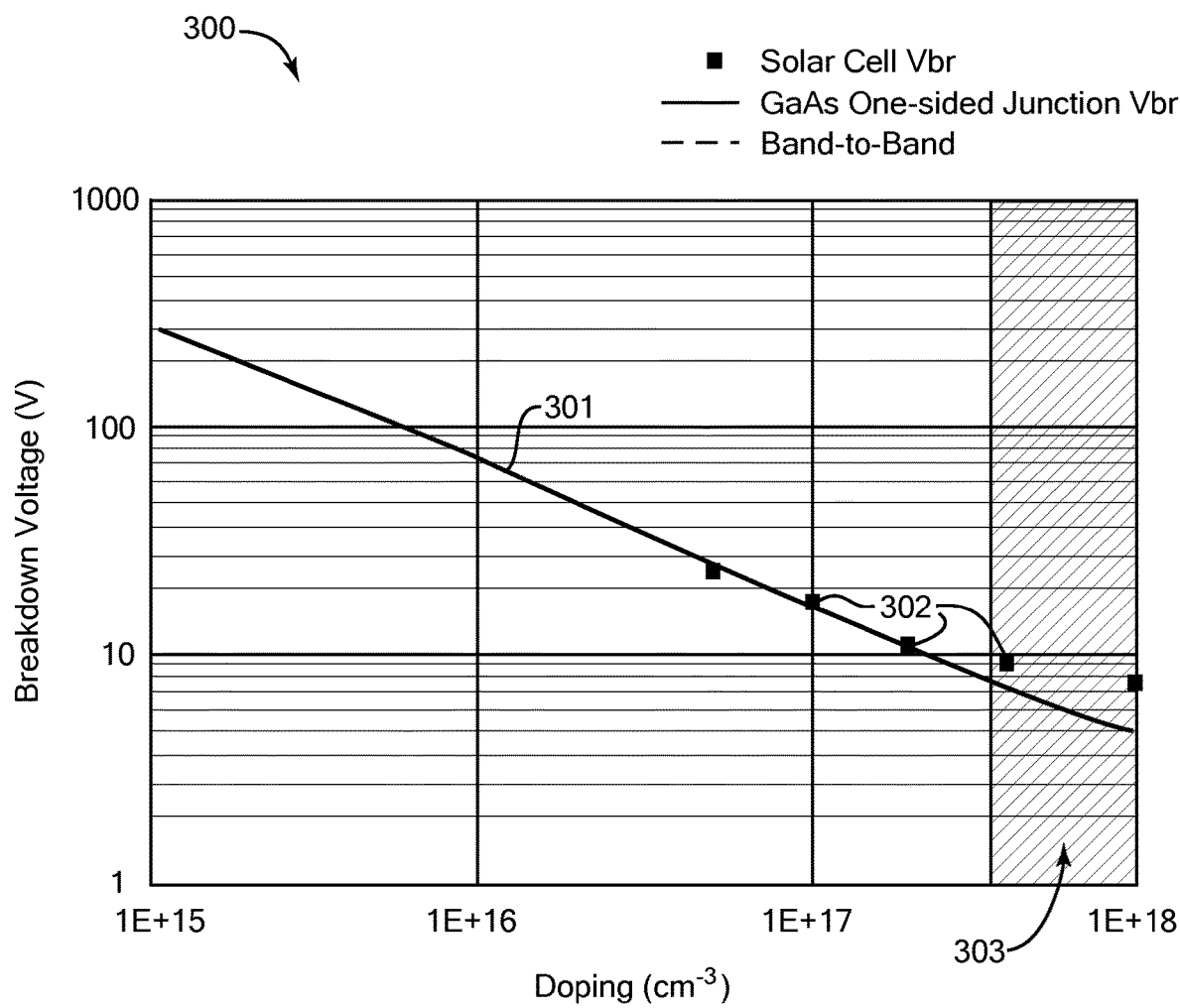
FIG. 8 is a graph illustrating doping and breakdown characteristics of a gallium arsenide based solar cell with respect to the bypass function described herein.

FIG. 8 shows a graph 300 illustrating the breakdown voltage for a gallium arsenide solar cell vs. the doping concentration in the absorber layer of the solar cell. The line 301 shows the behavior of a gallium arsenide one-sided junction (e.g., one half of a p-n junction, idealized behavior on other side of junction), and the data points 302 show the behavior of a gallium arsenide solar cell implemented in one embodiment as described herein. As shown in the graph, the breakdown voltage of the solar cell reduces as the doping concentration increases. For the band-to-band tunneling to take place before avalanche breakdown, the doping should be sufficiently high that the band-to-band tunneling occurs at a lower voltage than avalanche breakdown voltage. In this example, at a doping concentration of about $4 \times 10^{17}$ cm$^{-3}$ the band-to-band tunneling (Zener) breakdown effect takes place before avalanche breakdown as voltage increases, as well as for higher doping concentrations. This Zener breakdown region is shown as region 303 in FIG. 8. The Zener effect takes place at about 8-9 volts at that doping concentration in this example, and for higher doping concentrations the Zener effect takes place at lower voltages.

When the doping in the absorber layer is high enough, such as greater than $4 \times 10^{17}$ cm$^{-3}$ in the example described herein, then band-to-band tunneling becomes the dominating breakdown mechanism. In such a case, the solar cell has an intrinsic self-bypass path when reverse biased.

Figure 9:
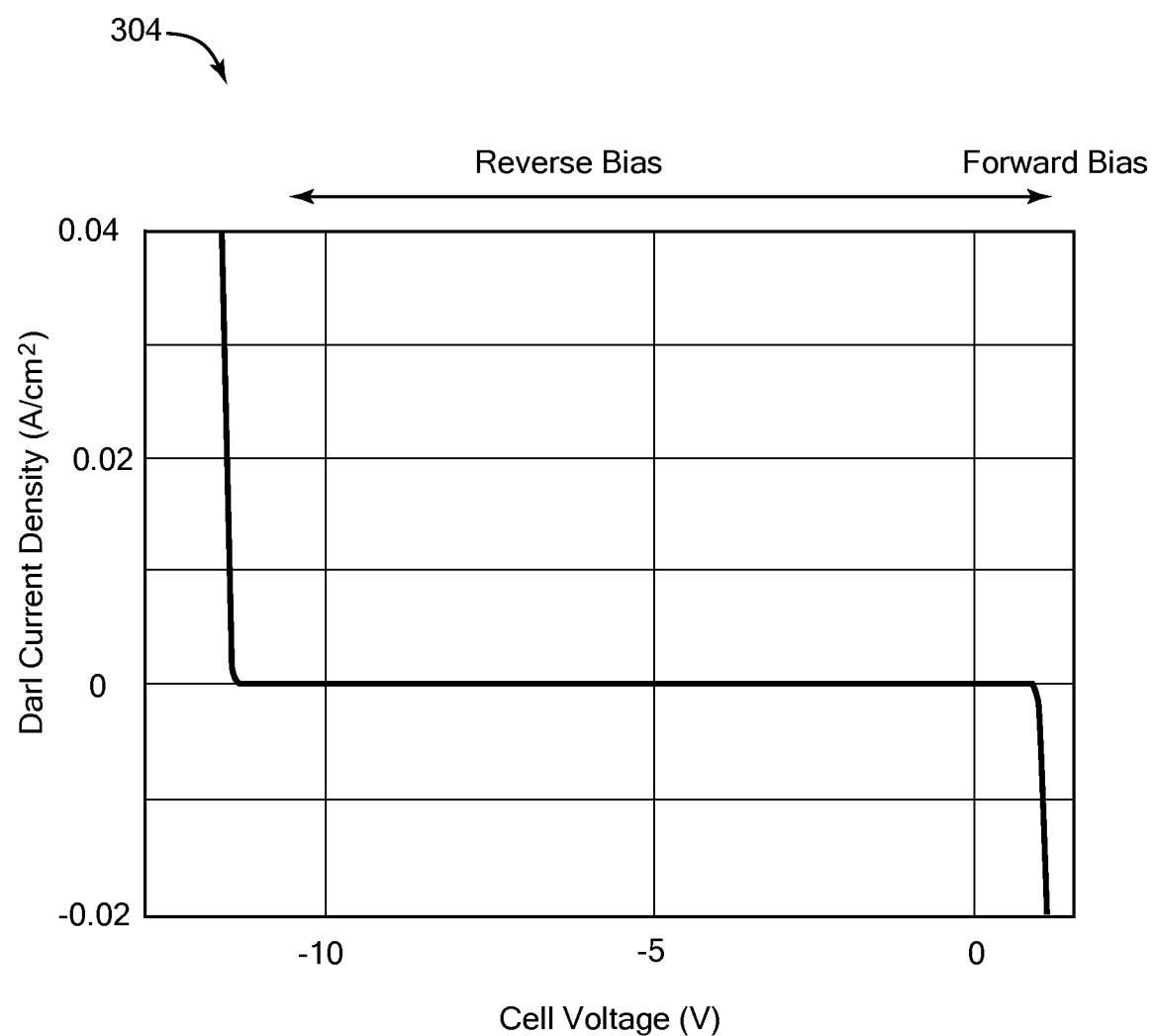
FIG. 9 is a graph illustrating voltage and current characteristics of a gallium arsenide based solar cell with respect to the bypass function described herein.

FIG. 9 shows a graph 304 illustrating the avalanche breakdown that occurs when a solar cell as described herein is sufficiently reverse-biased. Under reverse bias, no current flows in the solar cell until the breakdown voltage Vb is reached, at which magnitude current can flow with a greatly increased capability.

Figure 10:
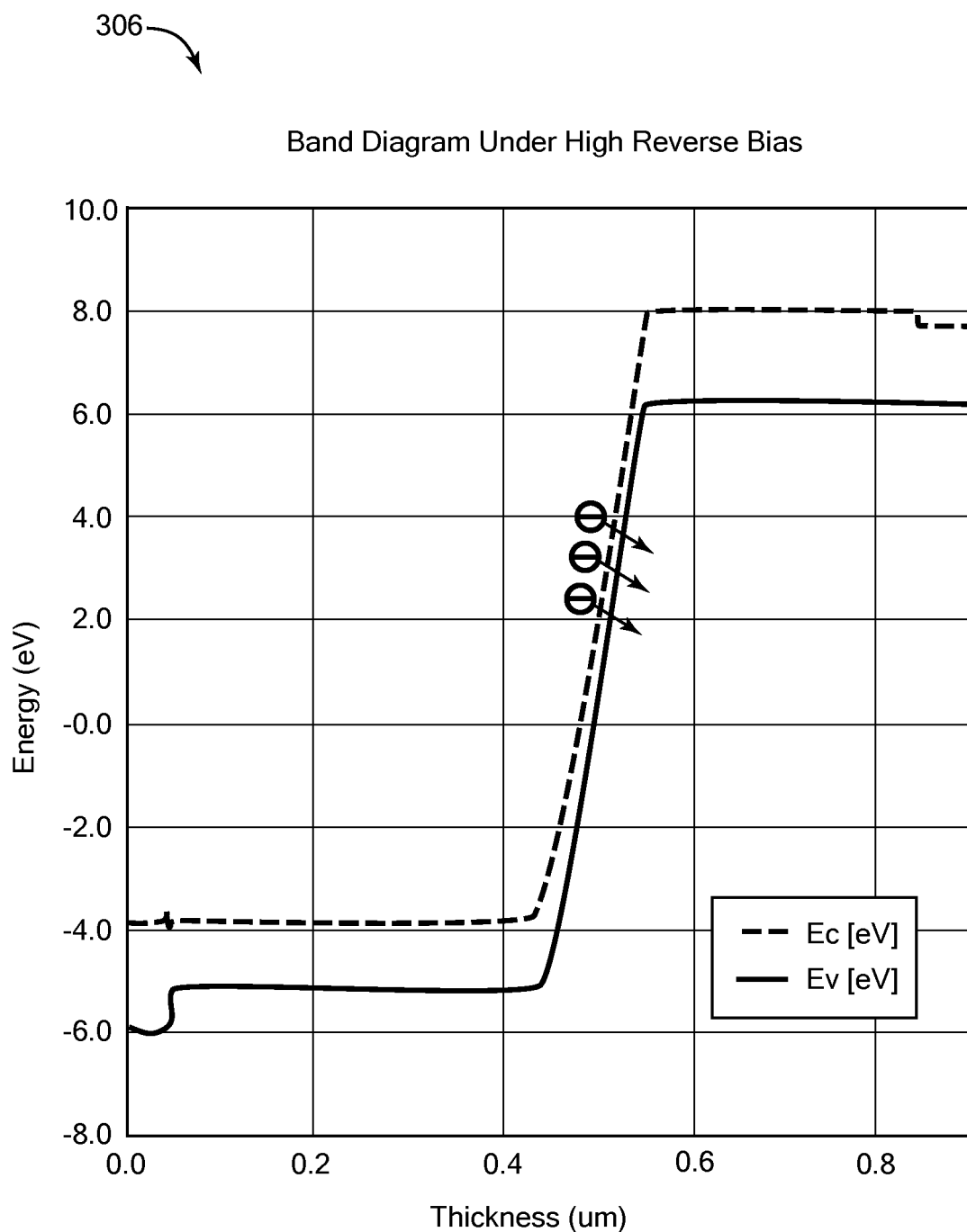
FIG. 10 is a graph illustrating band-to-band tunneling characteristics of a gallium arsenide based solar cell with respect to the bypass function described herein.

FIG. 10 shows a graph 306 illustrating a band diagram for a solar cell having the bypass function described herein is under high reverse bias (a reverse bias sufficient for Zener breakdown and less than sufficient to cause avalanche breakdown). Graph 306 indicates thickness or depth into the cell vs. energy of carriers, where the dashed line indicates the conduction band and the solid line indicates the valence band energy based on the depth into the solar cell from the top surface. As shown, band-to-band tunneling occurs when the energy bands are close together in a reverse bias field in the depletion region, which in the example of FIG. 10 is at a cell depth between 0.4 to 0.6 µm, and if the doping concentration is $4 \times 10^{17}$ cm$^{-3}$ or greater. This tunneling is the Zener effect.

Figure 11:
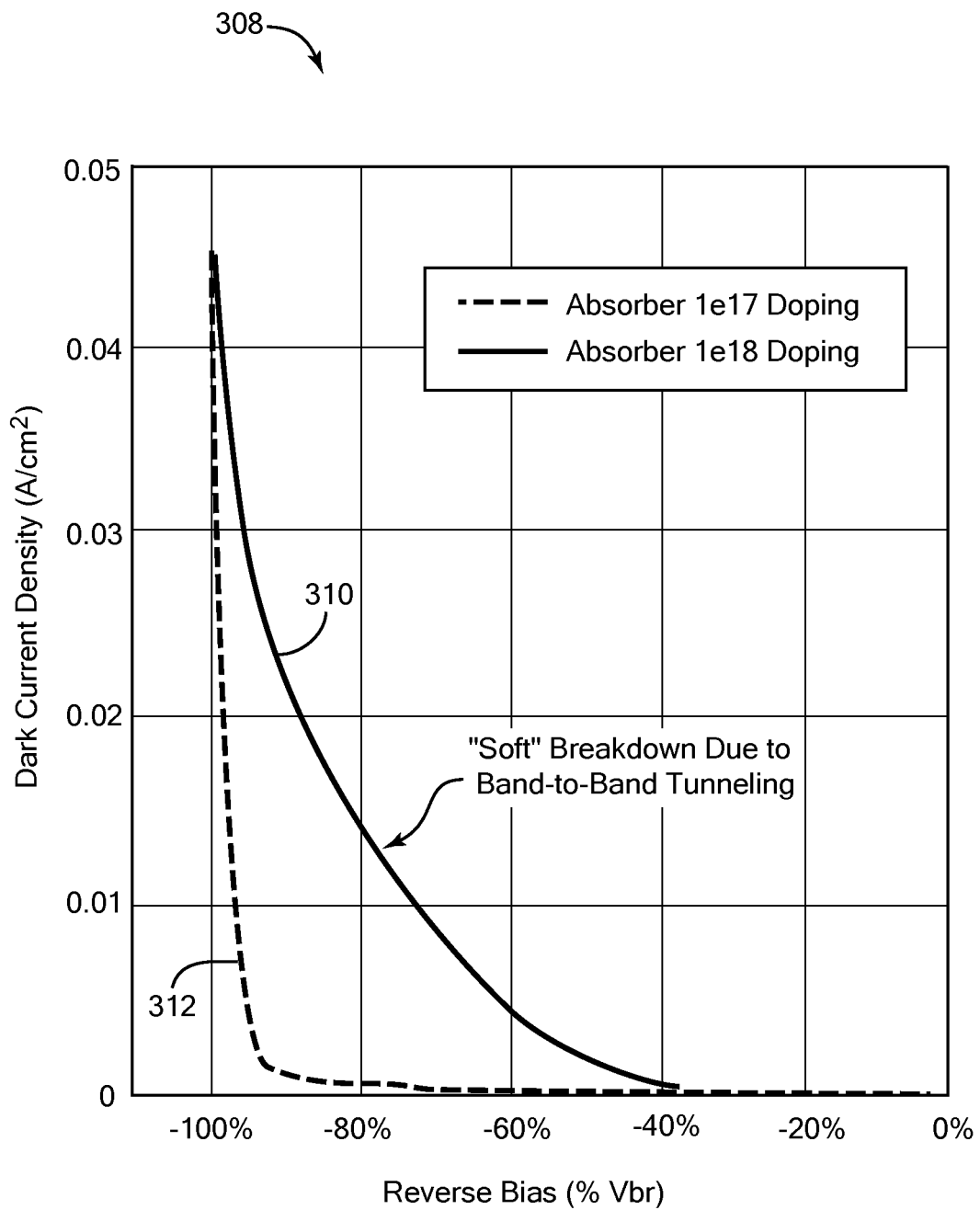
FIG. 11 is a graph illustrating voltage and current characteristics of a gallium arsenide based solar cell with respect to the bypass function described herein.

FIG. 11 shows a graph 308 illustrating a line 310 showing a "soft" (more gradual) breakdown effect in a solar cell at one magnitude of reverse bias, and a second line 312 showing a much more abrupt avalanche breakdown at a greater magnitude of reverse bias. The soft breakdown 310 is caused by the band-to-band tunneling occurring before avalanche breakdown can occur, in a solar cell having a greater absorber layer doping ($1 \times 10^{18}$ cm$^{-3}$), while the avalanche breakdown 312 occurs in a solar cell having less absorber layer doping ($1 \times 10^{17}$ cm$^{-3}$) and consequently no band-to-band tunneling effect.

As described above, gallium arsenide solar cells have been found to exhibit a Zener breakdown effect depending on the absorber layer doping concentration (and having a high emitter layer doping as described above). For example, thin absorber layers of about 0.7 to 2 µm thick have experienced avalanche breakdown at voltages about −10 V or more (in magnitude) if having an absorber layer doping concentration of 1 or $2 \times 10^{17}$ cm$^{-3}$. However, in devices having an absorber layer of about 0.7 to 1 µm thickness and a doping concentration of $4 \times 10^{17}$ cm$^{-3}$, Zener breakdown occurred before avalanche breakdown could occur, at voltages about −9V or less (in magnitude), thereby avoiding damage to the solar cell from destructive avalanche breakdown.

The highly-doped absorber layer of the solar cell 140 or 200 allows a Zener breakdown effect to take place under reverse bias before an avalanche breakdown effect. This Zener breakdown effect, or self-bypass diode functionality, is a controlled breakdown that allows current to flow for shaded cells and avoids any damage to the solar cell that can occur under avalanche breakdown. The reserve breakdown of the cell is thus dominated by band-to-band tunneling and self-bypass functionality instead of destructive avalanche breakdown.

The self-bypass functionality allows each solar cell in a string of solar cells to receive the protection of a bypass diode in shaded or other mismatch conditions, yet avoids the need to connect discrete bypass diodes. This reduces cost and time for design integration of discrete bypass diodes. Furthermore, when using the self-bypass diode functionality described herein, there is little or no compromise of efficiency between thickness, doping, and breakdown voltage characteristics of the solar cell.

The ability to provide the self-bypass function for photovoltaic cells based on gallium arsenide as described herein, rather than cells based on different, more exotic materials, allows more common and low-cost photovoltaic cells to be produced, using known techniques already used for gallium arsenide structures and cells.

Another advantage of the use of the Zener breakdown in solar cells as a self-bypass function is that non-shaded solar cells in a particular string of solar cells still produce power despite having one or more shaded cells in that string. Once the Zener breakdown voltage is reached in a particular cell (such as a shaded cell), that cell appears simply as a short circuit. In contrast, the use of distinct bypass diodes causes the entire string of solar cells to be bypassed when one or more of the cells is sufficiently shaded, such that none of the solar cells in the string are producing power.

Still another advantage of using the self-bypass diode function in solar cells is that Zener breakdown is relatively temperature insensitive compared to avalanche breakdown. Without Zener breakdown, the sensitivity of avalanche breakdown creates a restriction that at the lowest operating temperature of the solar cell, the entire string voltage of a series of solar cells must be less than the avalanche breakdown voltage. Thus, when designing around avalanche breakdown there are additional limits imposed by temperature sensitivity, which is not a limitation when utilizing the Zener breakdown as described herein.

Furthermore, embodiments can be provided, as described above, which allow the depletion region of the photovoltaic device to be at a lower doping concentration than the surrounding absorber layer, and still retain the bypass function described herein. For example, an intermediate layer at the p-n junction can have the lower doping concentration than the adjacent absorber layer. This allows greater design flexibility since the p-n junction can be designed without the restrictions of the high doping concentration needed for the self-bypass function.

The band-to-band tunneling effect described herein can be achieved at least in part by providing a high doping concentration in the absorber layer. In other embodiments, the band-to-band tunneling effect and self-bypass diode functionality can be achieved using other methods. The band-to-band tunneling effect should dominate the reverse bias condition and occur before an avalanche breakdown effect when increasing the magnitude of the reverse bias voltage.

Although the present inventions have been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A semiconductor device, comprising:
a semiconductor structure including a base layer configured to absorb photons to convert light energy into electrical energy at the semiconductor device, the base layer includes a Group III-V compound semiconductor; and
wherein the semiconductor structure includes an emitter layer, the emitter layer being made of a different material than the base layer and having a higher bandgap than the base layer,
wherein a p-n junction within the semiconductor structure is formed between the emitter layer and the base layer such that under reverse-bias conditions of the device the p-n junction provides a bypass function using a Zener breakdown effect that breaks down in a controlled manner,
wherein the base layer is highly doped within a range of about $4\times10^{17}$ cm$^{-3}$ to about $1\times10^{19}$ cm$^{-3}$, and a thickness of the base layer is within a range of about 300 nm to about 3,500 nm,
wherein the semiconductor structure includes an intermediate layer between the emitter layer and the base layer, and
further comprising a window layer disposed on a surface of the base layer and away from the emitter layer.

2. The semiconductor device of claim 1, wherein the device provides the bypass function with no distinct bypass diode connected to or included in the device.

3. The semiconductor device of claim 1, further comprising a contact layer disposed adjacent to the window layer and a metal layer disposed adjacent to the contact layer.

4. The semiconductor device of claim 1, wherein the p-n junction is formed at a location offset from a heterojunction in the semiconductor structure by up to about 200 nm.

5. The semiconductor device of claim 4, wherein the p-n junction being formed between the emitter layer and the intermediate layer, and the heterojunction being formed between the base layer and the intermediate layer.

6. The semiconductor device of claim 5, wherein the intermediate layer includes a gradation in material composition, from the material of the base layer to the material of the emitter layer.

7. The semiconductor device of claim 1, wherein the semiconductor device is a photovoltaic device.

8. The semiconductor device of claim 1, wherein the p-n junction is a heterojunction.

* * * * *